(12) United States Patent
Lee et al.

(10) Patent No.: US 11,132,252 B2
(45) Date of Patent: Sep. 28, 2021

(54) MEMORY DEVICE, MEMORY SYSTEM INCLUDING MEMORY DEVICE, AND METHOD OF OPERATING MEMORY SYSTEM

(71) Applicant: SK hynix Inc., Icheon-si (KR)

(72) Inventors: Tae Ho Lee, Icheon-si (KR); Byung Ryul Kim, Icheon-si (KR); Dae Il Choi, Hwaseong-si (KR); Yong Hwan Hong, Icheon-si (KR)

(73) Assignee: SK hynix Inc., Icheon-si (KR)

( * ) Notice: Subject to any disclaimer, the term of this patent is extended or adjusted under 35 U.S.C. 154(b) by 0 days.

(21) Appl. No.: 16/856,866

(22) Filed: Apr. 23, 2020

(65) Prior Publication Data

US 2021/0182144 A1 Jun. 17, 2021

(30) Foreign Application Priority Data

Dec. 11, 2019 (KR) .................. 10-2019-0164927

(51) Int. Cl.
*G06F 11/00* (2006.01)
*G06F 11/10* (2006.01)
(Continued)

(52) U.S. Cl.
CPC ...... *G06F 11/1004* (2013.01); *G06F 9/30101* (2013.01); *G06F 11/1068* (2013.01); *G06F 12/0246* (2013.01); *G06F 12/0882* (2013.01)

(58) Field of Classification Search
None
See application file for complete search history.

(56) References Cited

U.S. PATENT DOCUMENTS

| 6,697,276 B1 * | 2/2004 | Pereira | G11C 15/00 365/189.07 |
| 6,700,809 B1 * | 3/2004 | Ng | G11C 15/00 365/236 |

(Continued)

FOREIGN PATENT DOCUMENTS

| KR | 101131569 B1 | 4/2012 |
| KR | 1020180051704 A | 5/2018 |

OTHER PUBLICATIONS

S. Pontarelli, M. Ottavi and A. Salsano, "Error Detection and Correction in Content Addressable Memories," 2010 IEEE 25th International Symposium on Defect and Fault Tolerance in VLSI Systems, 2010, pp. 420-428, doi: 10.1109/DFT.2010.56. (Year: 2010).*

*Primary Examiner* — Daniel F. McMahon
(74) *Attorney, Agent, or Firm* — William Park & Associates Ltd.

(57) ABSTRACT

The memory device includes a content addressable memory (CAM) block including a plurality of pages, peripheral circuits configured to perform a CAM data read operation to read a CAM data comprising a plurality of check data each indicating whether bad block information is included in a region of the CAM data from a page sequentially selected among the plurality of pages, a CAM data read controller configured to perform a CAM data load operation to receive the CAM data from the peripheral circuits and output the CAM data to an external memory controller, and stop the CAM data load operation based on at least one check data among the plurality of check data included in the CAM data.

18 Claims, 10 Drawing Sheets

(51) Int. Cl.
*G06F 9/30* (2018.01)
*G06F 12/0882* (2016.01)
*G06F 12/02* (2006.01)

(56) References Cited

U.S. PATENT DOCUMENTS

| | | | |
|---|---|---|---|
| 7,257,763 B1* | 8/2007 | Srinivasan | G06F 11/1064 |
| | | | 714/718 |
| 2012/0268977 A1* | 10/2012 | Kang | G11C 15/04 |
| | | | 365/49.1 |
| 2017/0220413 A1* | 8/2017 | Cha | G06F 3/0619 |
| 2020/0202932 A1* | 6/2020 | You | G11C 16/16 |

* cited by examiner

MEMORY DEVICE, MEMORY SYSTEM INCLUDING MEMORY DEVICE, AND METHOD OF OPERATING MEMORY SYSTEM

CROSS-REFERENCE TO RELATED APPLICATION

The present application claims priority under 35 U.S.C. § 119(a) to Korean patent application number 10-2019-0164927 filed on Dec. 11, 2019, in the Korean Intellectual Property Office, the entire disclosure of which is incorporated herein by reference.

BACKGROUND

1. Technical Field

The present disclosure relates to an electronic device, and more particularly, to a memory device that performs a read operation and a load operation of cam data including bad block information, a memory system including the memory device, and a method of operating the memory system.

2. Related Art

Recently, a paradigm for a computer environment has been transformed into ubiquitous computing, which enables a computer system to be used whenever and wherever. Therefore, a use of a portable electronic device, such as a mobile phone, a digital camera, and a notebook computer, is rapidly increasing. Such a portable electronic device generally uses a memory system that uses a memory device, that is, a data storage device. The data storage device is used as a main storage device or an auxiliary storage device of the portable electronic device.

The data storage device, using the memory device, provides the advantages of stability and durability since there is no mechanical driver, the access speed of information is very fast, and the power consumption is low. As an example of a memory system having such advantages, a data storage device includes a universal serial bus (USB) memory device, a memory card having various interfaces, a solid state drive (SSD), and the like.

SUMMARY

A memory device according to an embodiment of the present disclosure includes a cam block including a plurality of pages, peripheral circuits configured to read a cam data of a page unit that is stored in a selected page among the plurality of pages of the cam block during a cam data read operation, a cam data read controller configured to receive the read cam data of the page unit from the peripheral circuits during a cam data load operation and configured to output the received cam data of the page unit as output cam data, and a control logic configured to control the peripheral circuits to perform the cam data read operation and the cam data load operation. The cam data read controller stops the cam data load operation based on a check data that is included in the read cam data of the page unit.

A memory system according to another embodiment of the present disclosure includes a memory device including a cam block in which a cam data is stored, reading the cam data of a page unit by sequentially selecting a plurality of pages, included in the cam block, during a cam data read operation, and outputting the read cam data of the page unit as output cam data during a cam data load operation, and a memory controller configured to receive the output cam data from the memory device and configured to update a bad block information based on the received output cam data. The memory device is configured to stop the cam data load operation based on a check data that is included in the cam data of the page unit.

A method of operating a memory system according to an embodiment of the present disclosure includes reading cam data of a page unit of a selected page, among a plurality of pages, included in a memory device, during a cam data read operation, loading the read cam data of the page unit to a memory controller during a cam data load operation, and stopping the cam data load operation based on check data that is included in the read cam data of the page unit.

DETAILED DESCRIPTION

Specific structural or functional descriptions of embodiments according to the concept which are disclosed in the present specification or application are illustrated only to describe the embodiments according to the concept of the present disclosure. The embodiments according to the concept of the present disclosure may be carried out in various forms and the descriptions are not limited to the embodiments described in the present specification or application.

Hereinafter, embodiments of the present disclosure will be described in detail with reference to the accompanying drawings, so that those skilled in the art to which the present disclosure pertains may easily carry out the technical spirit of the present disclosure.

An embodiment of the present disclosure provides a memory device capable of improving efficiency of cam data load operation, a memory system including the memory device, and a method of operating the memory system.

According to the present technology, operation performance of the memory device may be improved by stopping the cam data load operation based on the check data included in the cam data read during the cam data read operation.

Figure 1:
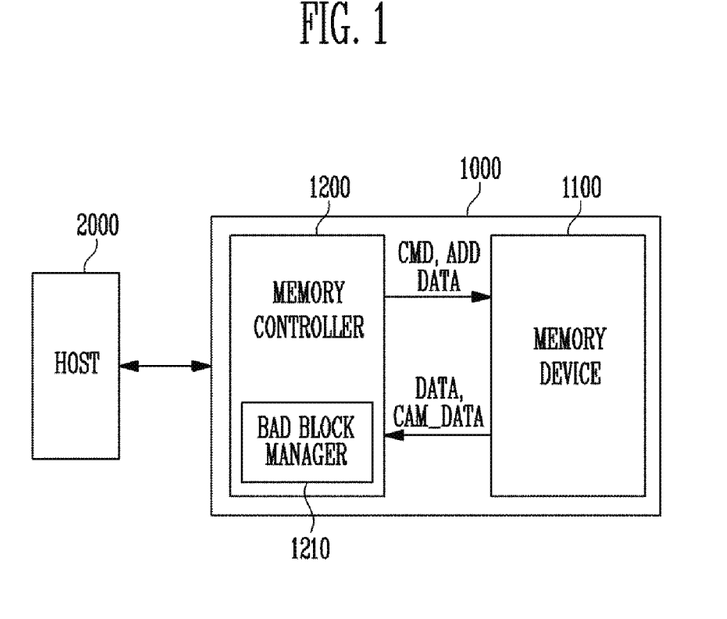
FIG. 1 is a diagram, illustrating a memory system, according to an embodiment of the present disclosure.

FIG. 1 is a diagram, illustrating a memory system, according to an embodiment of the present disclosure.

Referring to FIG. 1, the memory system 1000 includes a memory device 1100 in which data is stored, and a memory controller 1200 that controls the memory device 1100 based on the host 2000.

The host 2000 may communicate with the memory system 1000 by using an interface protocol, such as a peripheral component interconnect-express (PCI-E), an advanced technology attachment (ATA), a serial ATA (SATA), a parallel ATA (PATA), or a serial attached SCSI (SAS). In addition, the interface protocol, between the host 2000 and the memory system 1000, is not limited to the above-described example and may be one of a different type of interface protocols, such as a universal serial bus (USB), a multimedia card (MMC), an enhanced small disk interface (ESDI), and integrated drive electronics (IDE).

The memory controller 1200 may generally control the operations of the memory system 1000 and may control the exchange of data between the host 2000 and the memory device 1100. For example, the memory controller 1200 may control the memory device 1100 to program or read data based on a request from the host 2000. The memory controller 1200 may transmit a command CMD, an address ADD, and data DATA to be programmed to the memory device 1100 during a program operation. In addition, the memory controller 1200 may receive and temporarily store the data DATA, read from the memory device 1100 during a read operation, and transmit the temporarily stored the data DATA to the host 2000.

During a request of the host 2000, a test operation, or a power-on operation, the memory controller 1200 may control the memory device 1100 to read the cam data, stored in a cam block of the memory device 1100. For example, the memory controller 1200 may generate the command CMD, corresponding to a cam data read operation, and may transmit the command CMD to the memory device 1100. The memory controller 1200 may also manage a bad block based on cam data CAM_DATA that is received from the memory device 1100. The cam data CAM_DATA may include information regarding the bad block among a plurality of memory blocks that are included in the memory device 1100.

The memory controller 1200 may be configured to include a bad block manager 1210. The bad block manager 1210 may receive the cam data CAM_DATA from the memory device 1100. The bad block manager may also update and store the information regarding the bad block among the plurality of memory blocks that are included in the memory device 1100. The bad block manager 1210 may control the memory device 1100 so that the bad block is not selected during the operations of the memory device 1100 based on the stored information regarding the bad block. According to an embodiment, the memory device 1100 may include a double data rate synchronous dynamic random access memory (DDR SDRAM), a low power double data rate4 (LPDDR4) SDRAM, a graphics double data rate (GDDR) SDRAM, a low power DDR (LPDDR), a Rambus dynamic random access memory (RDRAM), or a flash memory.

The memory device 1100 may perform a program, read, or erase operation based on the memory controller 1200. In addition, the memory device 1100 may perform a cam data read operation in response to the command CMD, corresponding to the cam data read operation that is received from the memory controller 1200 during the request of the host 2000, the test operation, or the power-on operation. During the cam data read operation, the memory device 1100 may read the cam data CAM_DATA that is stored in the cam block in a page unit, and the memory device 1100 may check the data that is included in the read cam data of the page unit to continuously perform the cam data read operation or end the cam data read operation to perform the next operation. For example, when all of the at least one check data, included in the cam data CAM_DATA of the page unit, are a first data "0", the memory device 1100 may continuously perform the cam data read operation. When at least one of the at least one check data, included in the cam data CAM_DATA, is a second data "1", the memory device 1100 may end the cam data read operation and perform the next operation. The cam data CAM_DATA of the page unit may include a plurality of data segments, and each of the plurality of data segments may include the check data. When the corresponding plurality of data segments includes the bad block information, the check data may have the first data "0". When the corresponding plurality of data segments does not include the bad block information, the check data may have the second data "1". For example, all data of the data segment, which do not include the bad block information, may have the second data "1" that corresponds to an erase cell.

Figure 2:
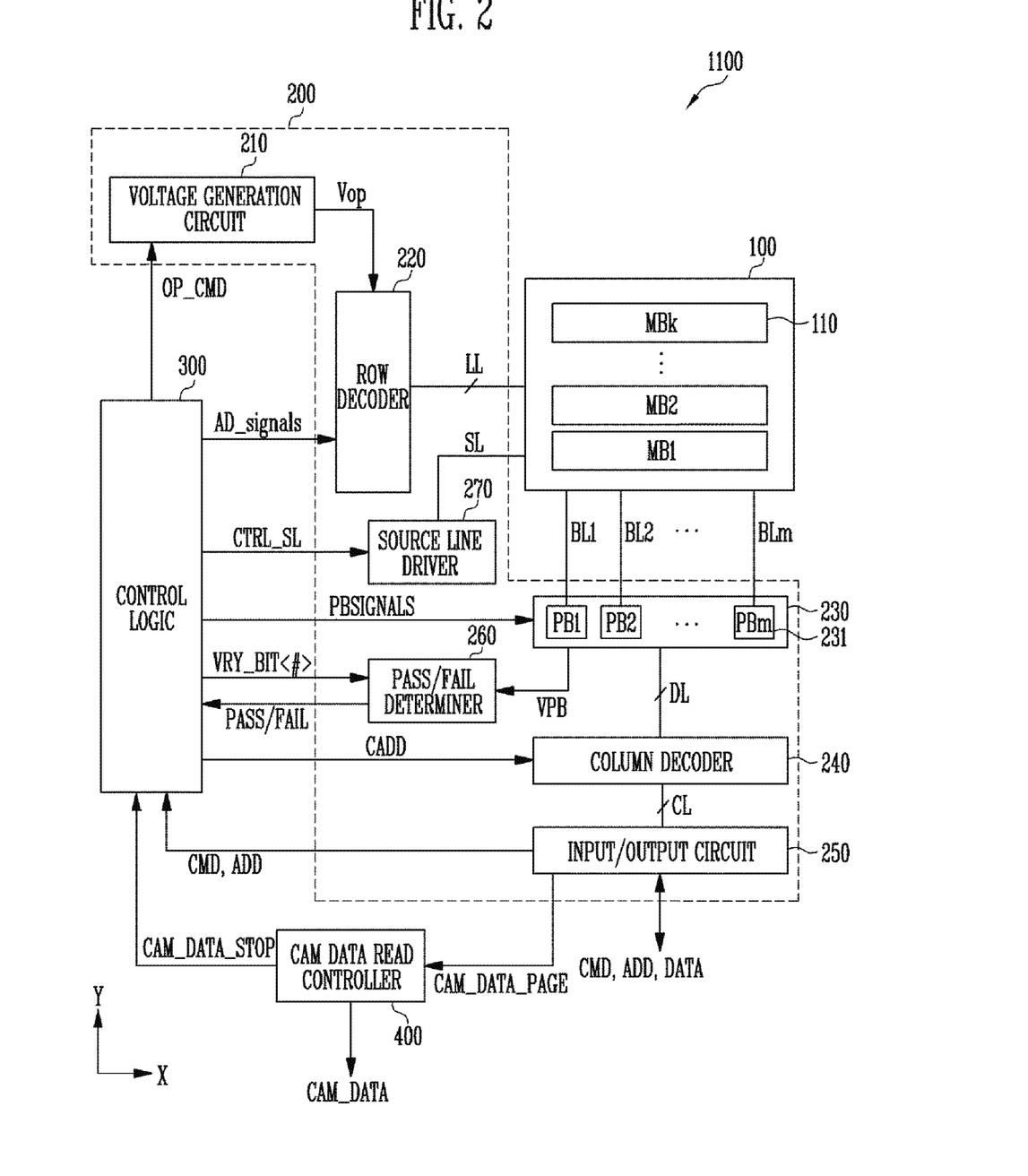
FIG. 2 is a diagram, illustrating a memory device of FIG. 1.

FIG. 2 is a diagram, illustrating the memory device of FIG. 1.

Referring to FIG. 2, the memory device 1100 may include a memory cell array 100 in which data is stored. The memory device 1100 may include peripheral circuits 200 that are configured to perform a program operation to store data in the memory cell array 100, to perform a read operation to output the stored data, and to perform an erase operation to erase the stored data. The memory device 1100 may include a control logic 300 that controls the peripheral circuits 200 based on the memory controller 1200 of FIG. 1. The memory device 1100 may include a cam data read controller 400 that determines the check data that is included in the cam data, read during the cam data read operation, and may stop the cam data read operation and the cam data load operation.

The memory cell array 100 may include a plurality of memory blocks MB1 to MBk (110, k being a positive integer). At least one memory block (for example, MB1) among the plurality of memory blocks MB1 to MBk (110) may be defined as a cam block in which a content addressable memory data (CAM) data is stored. Local lines LL and bit lines BL1 to BLm (m being a positive integer) may be connected to each of the memory blocks MB1 to MBk (110). For example, the local lines LL may include a first select line, a second select line, and a plurality of word lines, the plurality of word lines being arranged between the first and second select lines. In addition, the local lines LL may include dummy lines that are arranged between the first select line and the word lines. The local lines LL may also include dummy lines that are arranged between the second select line and the word lines. Here, the first select line may be a source select line, and the second select line may be a drain select line. For example, the local lines LL may include the word lines, the drain and source select lines, and source lines SL. For example, the local lines LL may further include the dummy lines. For example, the local lines LL may further include pipe lines. The local lines LL may be connected to the memory blocks MB1 to MBk (110), respectively, and the bit lines BL1 to BLm may be commonly connected to the memory blocks MB1 to MBk; 110. The memory blocks MB1 to MBk (110) may be implemented in a two-dimensional or three-dimensional structure. For example, the memory cells may be arranged in a direction that is parallel to a substrate in the memory block 110 of the two-dimensional structure. For example, the memory cells may be stacked in a direction that is perpendicular to the substrate in the memory block 110 of the three-dimensional structure.

The peripheral circuits 200 may be configured to perform the program, read, and erase operations of the selected memory block 110 based on the control logic 300. For example, the peripheral circuits 200 may include a voltage generation circuit 210, a row decoder 220, a page buffer group 230, a column decoder 240, an input/output circuit 250, a pass/fail determiner (pass/fail check circuit) 260, and a source line driver 270.

The voltage generation circuit 210 may generate various operation voltages Vop that are used in the program, read, and erase operations in response to an operation signal OP_CMD. In addition, the voltage generation circuit 210 may selectively discharge the local lines LL in response to the operation signal OP_CMD. For example, the voltage generation circuit 210 may generate a program voltage, a read voltage, a pass voltage, and the like based on the control logic 300.

The row decoder 220 may transfer the operation voltages Vop to the local lines LL that are connected to the selected memory block 110 in response to the row decoder control signals AD_signals. For example, during the read operation, the row decoder 220 may apply the read voltage that is generated in the voltage generation circuit 210 to the selected word line among the local lines LL and may apply the pass voltage that is generated in the voltage generation circuit 210 to the remaining unselected word lines, in response to the row decoder control signals AD_signals. In addition, during the program operation, the row decoder 220 may apply the program voltage that is generated by the voltage generation circuit 210 to the selected word line among the local lines LL and may apply the pass voltage that is generated in the voltage generation circuit 210 to the remaining unselected word lines, in response to the row decoder control signals AD_signals.

The page buffer group 230 may include a plurality of page buffers PB1 to PBm (231) that is connected to the bit lines BL1 to BLm. The page buffers PB1 to PBm (231) may operate in response to page buffer control signals PBSIGNALS. For example, during the program operation, the page buffers PB1 to PBm (231) may temporarily store data to be programmed and may adjust a potential level of the bit lines BL1 to BLm based on the temporarily stored data to be programmed. In addition, during the read or verify operation, the page buffers PB1 to PBm (231) may sense a voltage or a current of the bit lines BL1 to BLm and read data.

The column decoder 240 may transfer data between the input/output circuit 250 and the page buffer group 230 in response to a column address CADD. For example, the column decoder 240 may exchange data with the page buffers 231 through data lines DL or may exchange data with the input/output circuit 250 through column lines CL.

The input/output circuit 250 may transfer the command CMD and the address ADD that are received from the memory controller 1200 of FIG. 1 to the control logic 300 or may exchange the data DATA with the column decoder 240. The input/output circuit 250 may transmit the cam data CAM_DATA_PAGE of the page unit that is received through the column decoder 240 to the cam data read controller 400 during the cam data read operation.

The pass/fail determiner 260 may generate a reference current in response to a permission bit VRY_BIT<#> during the read operation or the verify operation, compare a sensing voltage VPB that is received from the page buffer group 230 with a reference voltage that is generated by the reference current, and output a pass signal PASS or a fail signal FAIL. The sensing voltage VPB may be a voltage that is controlled based on the number of memory cells, determined as a pass during a program verify operation.

The source line driver 270 may be connected to the memory cell that is included in the memory cell array 100 through the source line SL and may control a voltage that is applied to the source line SL. The source line driver 270 may receive a source line control signal CTRL_SL from the control logic 300 and may control a source line voltage, applied to the source line SL, based on the source line control signal CTRL_SL.

The control logic 300 may output the operation signal OP_CMD, the row decoder control signals AD_signals, the page buffer control signals PBSIGNALS, and the permission bit VRY_BIT<#> in response to the command CMD and the address ADD to control the peripheral circuits 200. In addition, the control logic 300 may determine whether the verify operation has passed or failed in response to the pass signal PASS or the fail signal FAIL. In addition, in response to a cam data load operation stop signal CAM_DATA_STOP that is output from the cam data read controller 400, the control logic 300 may control the peripheral circuits 200 to read the cam data that is stored in a cam block MB1 in the page unit during the cam data read operation and may control the peripheral circuits 200 to stop the cam data read operation of the next page and the cam data load operation that transmits the currently read cam data to the cam data read controller 400 and outputting the cam data to an exterior device.

During the cam data load operation, the cam data read controller 400 receives the cam data CAM_DATA_PAGE of the page unit that is received through the input/output circuit 250 and checks whether there is a check data of which the data value is the second data "1" among the data values of the check data, included in the received cam data CAM_DATA_PAGE of the page unit. As a result of the check, when the at least one check data, included in the cam data CAM_DATA_PAGE of the page unit, is the second data "1", the cam data read controller 400 may generate and output the cam data load operation stop signal CAM_DATA_STOP to stop the cam data read operation and cam data load operation. In addition, as a result of the check, when at least one check data, included in the cam data CAM_DATA_PAGE of the page unit, is the second data "1", the cam data read controller 400 may mask data segments of which the check data is the second data "1" and may output the cam data CAM_DATA, including remaining data segments, to the exterior device (for example, the memory controller 1200 of FIG. 1).

Figure 3:
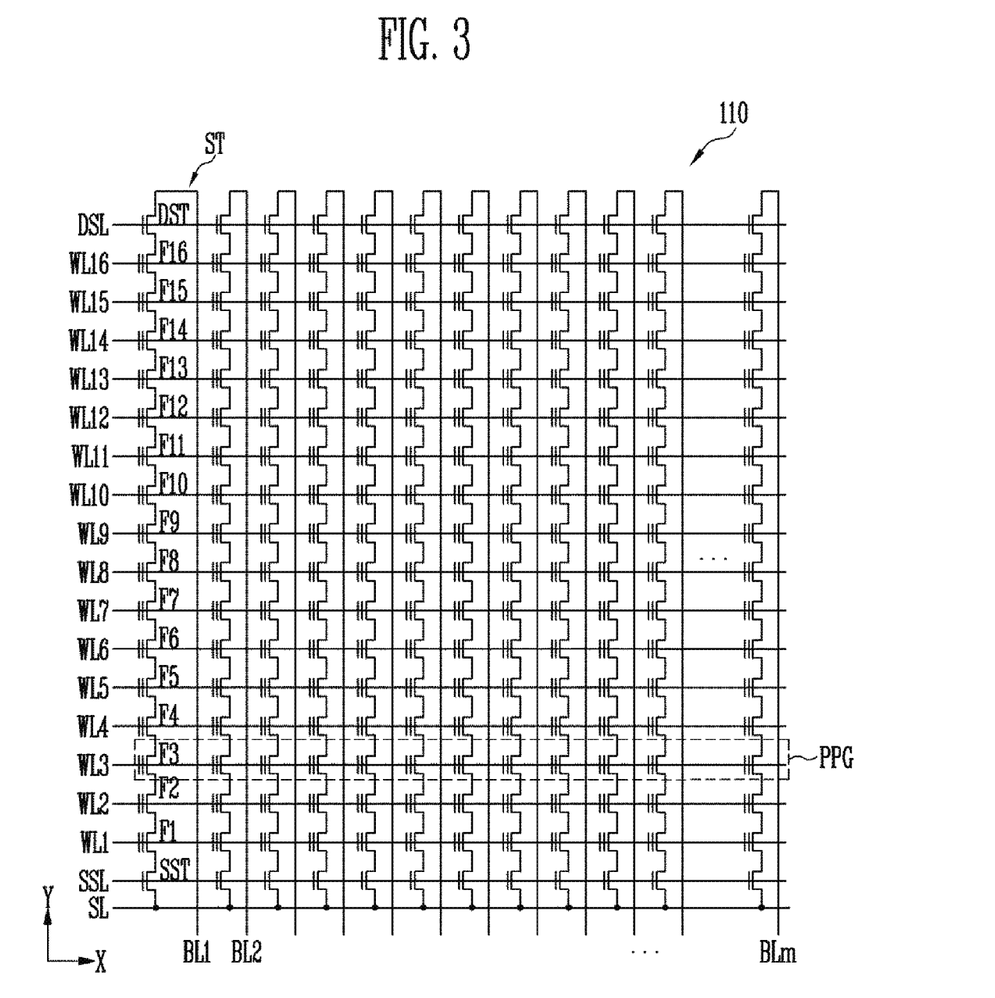
FIG. 3 is a diagram, illustrating a memory block of FIG. 2.

FIG. 3 is a diagram, illustrating the memory block of FIG. 2.

Referring to FIG. 3, the memory block 110 may be connected to a plurality of word lines that are arranged in parallel with each other between the first select line and the second select line. Here, the first select line may be the source select line SSL, and the second select line may be the drain select line DSL. More specifically, the memory block 110 may include a plurality of strings ST that are connected between the bit lines BL1 to BLm and the source line SL. The bit lines BL1 to BLm may be connected to the respective strings ST, and the strings ST may be commonly connected to the source line SL. Since the strings ST are configured to be identical to each other, a string ST, connected to the first bit line BL1, will be specifically described below.

The string ST may include a source select transistor SST, a plurality of memory cells F1 to F16, and a drain select transistor DST, connected in series, between the source line SL and the first bit line BL1. One string ST may include at least one or more of the source select transistor SST and the drain select transistor DST, and the string ST may include the memory cells F1 to F16 more than the number shown in the figure.

A source of the source select transistor SST may be connected to the source line SL, and a drain of the drain select transistor DST may be connected to the first bit line BL1. The memory cells F1 to F16 may be connected, in series, between the source select transistor SST and the drain select transistor DST. Gates of the source select transistors SST, included in the different strings ST, may be connected to the source select line SSL. Gates of the drain select transistors DST may be connected to the drain select line DSL. Furthermore, gates of the memory cells F1 to F16 may be respectively connected to corresponding word lines of the plurality of word lines WL1 to WL16. A group of the memory cells that are connected to the same word line among the memory cells, included in different strings ST, may be referred to as a page PPG. Therefore, the memory block 11 may include the pages PPG of the number of the word lines WL1 to WL16.

Figure 4:
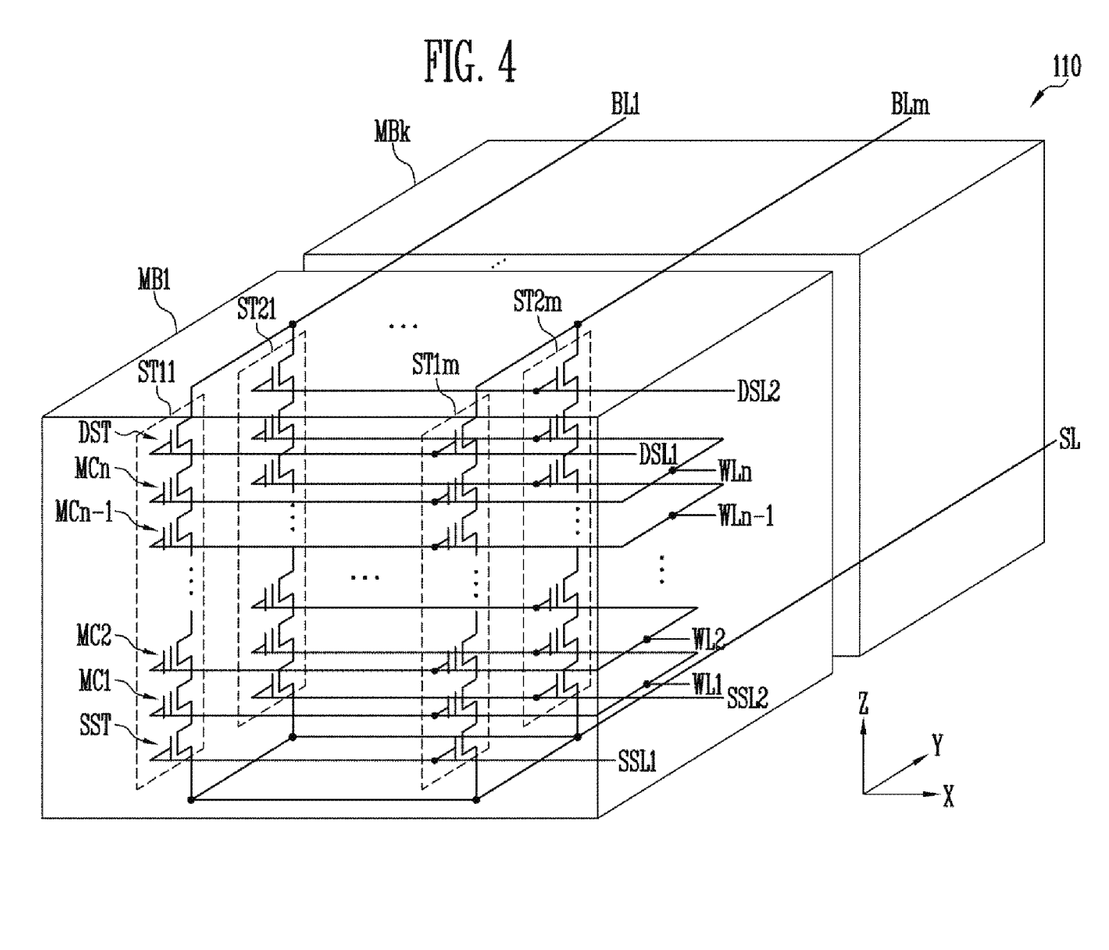
FIG. 4 is a diagram, illustrating an embodiment of a memory block configured in a three-dimension.

FIG. 4 is a diagram, illustrating an embodiment of a memory block configured in a three-dimension.

Referring to FIG. 4, the memory cell array 100 may include a plurality of memory blocks MB1 to MBk (110). The memory block 110 may include a plurality of strings ST11 to ST1m and ST21 to ST2m. As an embodiment, each of the plurality of strings ST11 to ST1m and ST21 to ST2m may be formed in an 'I' shape or a 'U' shape. In the first memory block MB1, m strings may be arranged in a row direction (X direction). In FIG. 4, two strings are arranged in a column direction (Y direction). However, this is for convenience of description, and three or more strings may be arranged in the column direction (Y direction).

Each of the plurality of strings ST11 to ST1m and ST21 to ST2m to ST2m may include at least one source select transistor SST, first to n-th memory cells MC1 to MCn, and at least one drain select transistor DST.

The source select transistor SST of each string may be connected between the source line SL and the memory cells MC1 to MCn.

The source select transistors of the strings that are arranged in the same row may be connected to the same source select line. The source select transistors of the strings ST11 to ST1m that are arranged in the first row may be connected to a first source select line SSL1. The source select transistors of the strings ST21 to ST2m that are arranged in the second row may be connected to a second source select line SSL2. As another embodiment, the source select transistors of the strings ST11 to ST1m and ST21 to ST2m may be commonly connected to one source select line.

The first to n-th memory cells MC1 to MCn of each string may be connected to each other, in series, between the source select transistor SST and the drain select transistor DST. Gates of the first to n-th memory cells MC1 to MCn may be connected to the first to n-th word lines WL1 to WLn, respectively.

As an embodiment, at least one of the first to n-th memory cells MC1 to MCn may be used as a dummy memory cell. When the dummy memory cell is provided, a voltage or a current of a corresponding string may be stably controlled. Therefore, reliability of the data that is stored in the memory block 110 may be improved.

The drain select transistor DST of each string may be connected between the bit line and the memory cells MC1 to MCn. The drain select transistors DST of the strings that are arranged in the row direction may be connected to the drain select line extending in the row direction. The drain select transistors DST of the strings ST11 to ST1m of the first row may be connected to a first drain select line DSL1. The drain select transistors DST of the strings ST21 to ST2m of the second row may be connected to a second drain select line DSL2.

Figure 5:
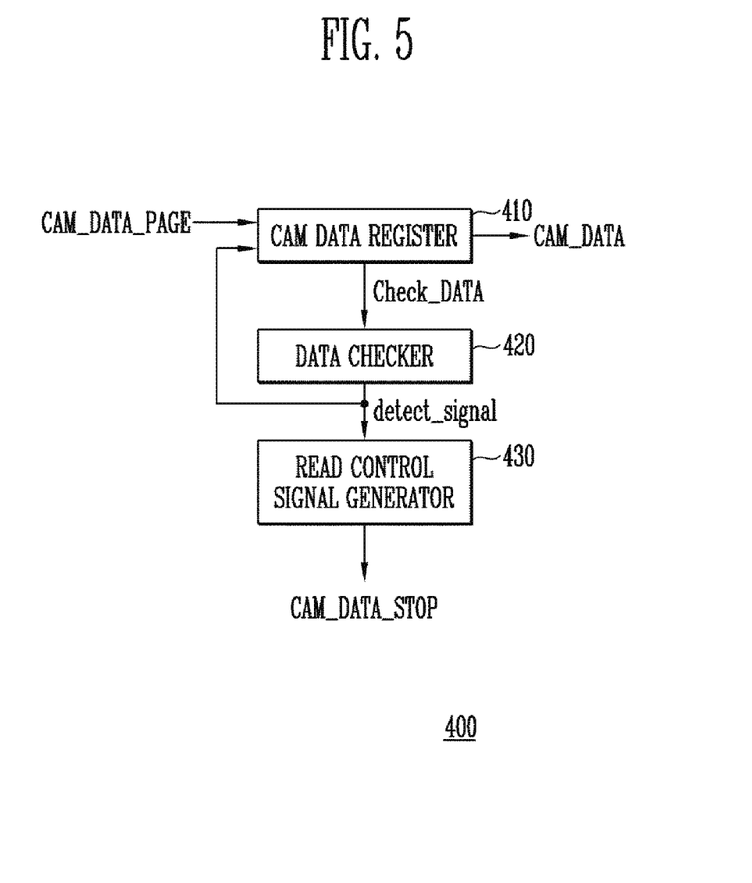
FIG. 5 is a block diagram, illustrating cam data read controller 400 of FIG. 2.

FIG. 5 is a block diagram, illustrating the cam data read controller 400 of FIG. 2.

Referring to FIG. 5, the cam data read controller 400 may include a cam data register 410, a data checker 420, and a read control signal generator 430.

The cam data register 410 may temporarily store the cam data CAM_DATA_PAGE of the page unit, received through the input/output circuit 250 of FIG. 2 during the cam data read operation, and may output a plurality of check data Check_DATA that is arranged in specific positions among the stored cam data CAM_DATA_PAGE of the page unit.

The data checker 420 may check the data value of the plurality of check data Check_DATA that is received from the cam data register 410 and may generate a detection signal detect_signal. For example, when the plurality of check data Check_DATA that is received from the cam data register 410 includes at least one second data "1", the data checker 420 may activate and output the detection signal detect_signal. On the other hand, when all of the plurality of check data Check_DATA, received from the cam data register 410, are the first data "0", the data checker 420 may deactivate the detection signal detect_signal.

The read control signal generator 430 may generate and output the cam data load operation stop signal CAM_DATA_STOP to stop the cam data read operation and the cam data load operation in response to the detection signal detect_signal received from the data checker 420. For example, when the detection signal detect_signal is activated and received, the read control signal generator 430 may activate and output the cam data load operation stop signal CAM_DATA_STOP, and when the detection signal detect_signal is deactivated, the read control signal generator 430 may deactivate the cam data load operation stop signal CAM_DATA_STOP.

The cam data register 410 may output the stored cam data CAM_DATA_PAGE of the page unit as the cam data CAM_DATA or may mask the data segments of which the check data is the second data "1" among the stored cam data CAM_DATA_PAGE of the page unit. The cam data register 410 may output the remaining data segments as the cam data CAM_DATA in response to the detection signal detect_signal that is received from the data checker 420. For example, when the detection signal detect_signal is activated, the cam data register 410 may mask the data segment of which the check data is the second data "1" and may output the remaining data segments as the cam data CAM_DATA. When the detection signal detect_signal is deactivated, the cam data register 410 may output the stored cam data CAM_DATA_PAGE of the page unit as the cam data CAM_DATA.

Figure 6:
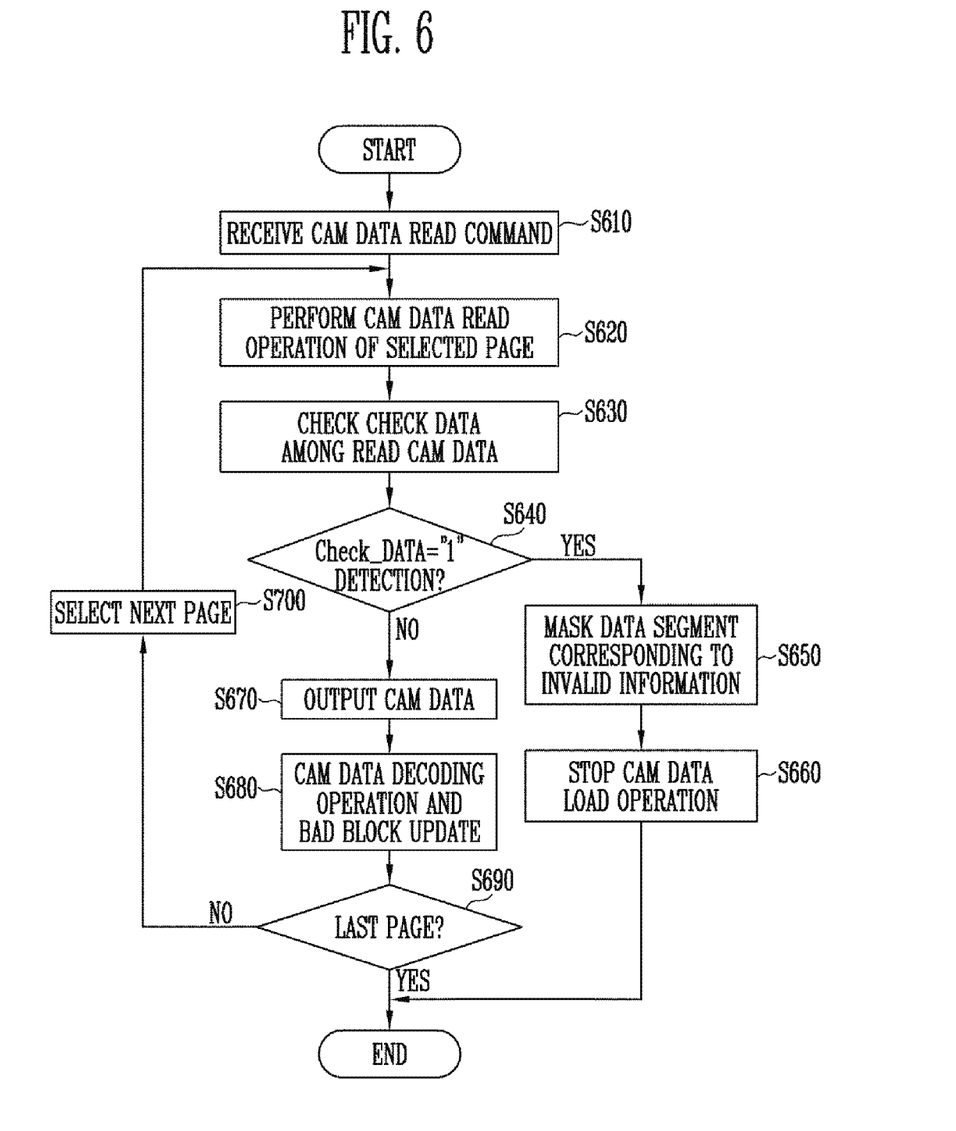
FIG. 6 is a flowchart, illustrating a method of operating the memory system, according to an embodiment.

FIG. 6 is a flowchart, illustrating a method of operating the memory system according to an embodiment.

Figure 7:
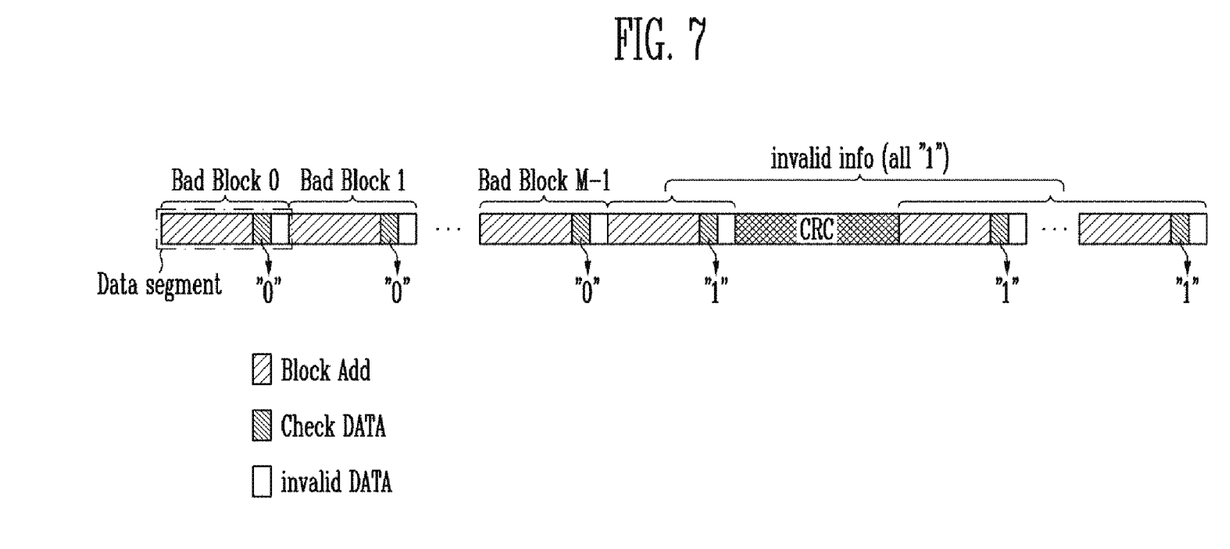
FIG. 7 is a diagram, illustrating cam data of a page unit, according to an embodiment of the present disclosure.

FIG. 7 is a diagram, illustrating the cam data of the page unit, according to an embodiment of the present disclosure.

The cam data read operation of the memory system will be described below with reference to FIGS. 1 to 7.

The memory device 1100 may receive the command CMD that corresponds to the cam data read operation, that is, a cam data read command from the memory controller 1200 during a request from the host 2000, during a test operation, or during a power-on operation (S610).

The control logic 300 of the memory device 1100 may perform the read operation of the cam block (for example, MB1) in response to the cam data read command and may control the peripheral circuits 200 to perform the read operation on a selected page among the plurality of pages PPG that are included in the cam block MB1 (S620).

For example, the voltage generation circuit 210 may generate and output the read voltage and the pass voltage in response to the operation signal OP_CMD. Furthermore, the row decoder 220 may apply the read voltage that is generated in the voltage generation circuit 210 to the selected word line among the local lines LL and may apply the pass voltage, generated in the voltage generation circuit 210, to the remaining unselected word lines in response to the row decoder control signals AD_signals.

The page buffers PB1 to PBm (231) may sense the voltage or current of the bit lines BL1 to BLm to read and temporarily store the cam data CAM_DATA_PAGE of the page unit that is stored in the selected page PPG. The cam data CAM_DATA_PAGE of the page unit that is temporarily stored in the page buffers PB1 to PBm (231) may be transmitted to the cam data read controller 400 through the column decoder 240 and the input/output circuit 250.

The cam data of the page unit may include a plurality of data segments Data segment and cyclic redundancy check (CRC) code data as shown in FIG. 7. Each data segment Data segment may correspond to one bad block information and may include a block address Block Add and the check data Check DATA. For example, when M bad block information is stored in the selected page PPG of the cam block MB1, a first data segment to an M-th data segment among the plurality of data segments, included in the cam data of the page unit, may sequentially correspond to the M bad block information Bad Block 0 to Bad Block M−1, one by one. In addition, the remaining data segments that exclude the first data segment to the M-th data segment may correspond to invalid information invalid info, and all data values of the remaining data segments may have the second data "1". When the corresponding data segment includes the bad block information, the check data Check DATA may have the first data "0", and when the corresponding data segment does not include the bad block information, the check data Check DATA may have the second data "1". Since the first data segment to the M-th data segment sequentially correspond to the M bad block information Bad Block 0 to Bad Block M−1, one by one, the check data Check DATA that is included in the first data segment to the M-th data segment may be the first data "0". Since the remaining data segments correspond to the invalid information invalid info, the check data Check DATA of the remaining data segments may be the second data "1".

The plurality of bad block information may be stored in at least one page of the cam block. For example, when the number of bad blocks is 300 and one page is capable of storing a maximum of 254 bad block information, the 254 bad block information may be stored in a first page and 46 bad block information may be stored in a second page. In addition, the 46 bad block information that is stored in the second page may be allocated to a first data segment to forty-sixth data segment among the 254 data segments that may be stored in the second page.

The cam data read controller 400 may check the plurality of check data Check_DATA that is arranged at specific positions among the cam data CAM_DATA_PAGE of the page unit, received through the input/output circuit 250 (S630).

For example, the cam data register 410 may receive and store the cam data CAM_DATA_PAGE of the page unit and may output the plurality of check data Check_DATA that is arranged in specific positions among the stored cam data CAM_DATA_PAGE of the page unit. The data checker 420 checks the data value of the plurality of check data Check_DATA that is received from the cam data register 410.

As a result of the check (S640), when the check data with a value of the second data "1" among the plurality of check data Check DATA is detected (Yes), the data segment that corresponds to the invalid information with a value of the second data "1" may be masked (S650). For example, in response to the activated detection signal detect_signal received from the data checker 420, the cam data register 410 may mask the data segment of which the check data is the second data "1" among the stored cam data CAM_DATA_PAGE of the page unit and perform the cam data load operation to sequentially transmit the data segments of which the check data is the first data "0" and the CRC code data to the memory controller 1200.

The read control signal generator 430 may output the cam data load operation stop signal CAM_DATA_STOP in response to the activated detection signal detect_signal, and the control logic 300 may stop the cam data load operation by stopping the operation that transmits the cam data of the page unit that is stored in the page buffer group 230 to the cam data read controller 400 in response to the cam data load operation stop signal CAM_DATA_STOP output from the cam data read controller 400 (S660).

As a result of the check described above (S640), when all of the plurality of check data Check_DATA are the first data "0" (No), it may be determined that all of the plurality of data segments, included in the cam data CAM_DATA_PAGE of the page unit, read from the selected page, include the bad block information, and the cam data load operation stop signal CAM_DATA_STOP may be deactivated. The cam data register 410 may sequentially transmit all data segments and the CRC code data, included in the stored cam data CAM_DATA_PAGE of the page unit as the cam data CAM_DATA, to the memory controller 1200 in response to the deactivated detection signal detect_signal received from the data checker 420 (S670).

The memory controller 1200 may receive the cam data CAM_DATA from the memory device 1100, may decode the cam data CAM_DATA using the CRC code data that is included in the cam data CAM_DATA, and may update and register the bad block based on the decoded cam data CAM_DATA (S680).

The control logic 300 may check whether the selected page on which the current read operation is performed is the last page of the cam block MB1 (S690).

As a result of the check described above (S690), when the selected page on which the current read operation is performed is not the last page of the cam block MB1 (No), the control logic 300 may control the peripheral circuits 200 to perform step S620 again for the next page by selecting the next page of the cam block MB1 in step S700. When the selected page on which the current read operation is performed is the last page of the cam block MB1 (Yes), the control logic 300 may end the cam data read operation and load operation.

As described above, according to an embodiment of the present disclosure, the data segment in which the invalid information is stored may be detected by using the check data, included in each of the plurality of data segments, included in the cam data of the page unit, read from the selected page. When the data segment in which the invalid information is stored is detected, the data segment in which the invalid information is stored may be masked. Only the remaining data segments may be loaded to the memory controller, and then the cam data load operation may be stopped. Therefore, the efficiency of the cam data load operation may be improved. In addition, the decoding operation speed may be improved by selectively loading only the data segments that include the bad block information among the read cam data of the page unit to the memory controller and performing a decoding operation.

Figure 8:
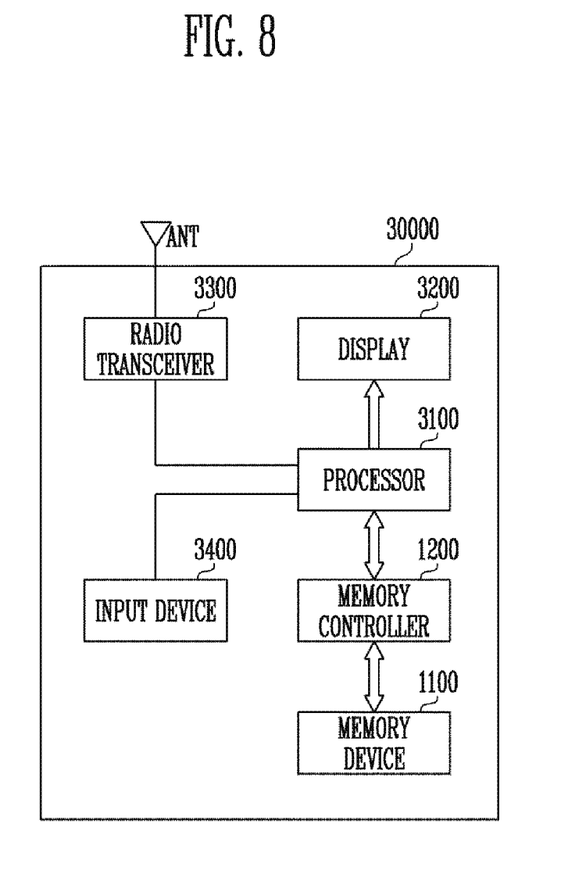
FIG. 8 is a diagram, illustrating another embodiment of the memory system.

FIG. 8 is a diagram, illustrating another embodiment of the memory system.

Referring to FIG. 8, the memory system 30000 may be implemented as a cellular phone, a smart phone, a tablet PC, a personal digital assistant (PDA), or a wireless communication device. The memory system 30000 may include the memory device 1100 and the memory controller 1200, the memory controller 1200 being capable of controlling the operations of the memory device 1100. The memory controller 1200 may control data access operations, such as a program operation, an erase operation, or a read operation, of the memory device 1100 based on a processor 3100.

Data, programmed in the memory device 1100, may be output through a display 3200 based on the memory controller 1200.

A radio transceiver 3300 may transmit and receive a radio signal through an antenna ANT. For example, the radio transceiver 3300 may convert a radio signal, received through the antenna ANT into a signal that may be processed by the processor 3100. Therefore, the processor 3100 may process the signal that is output from the radio transceiver 3300 and may transmit the processed signal to the memory controller 1200 or the display 3200. The memory controller 1200 may program the signal that is processed by the processor 3100 to the memory device 1100. In addition, the radio transceiver 3300 may convert a signal that is output from the processor 3100 into a radio signal, and may output the converted radio signal to an external device through the antenna ANT. An input device 3400 may be a device that is capable of inputting a control signal to control the operation of the processor 3100 or the data to be processed by the processor 3100. The input device 3400 may be implemented as a pointing device, such as a touch pad or a computer mouse, a keypad, or a keyboard. The processor 3100 may control the operation of the display 3200 so that the data that is output from the memory controller 1200, the data that is output from the radio transceiver 3300, or the data that is output from the input device 3400 is output through the display 3200.

According to an embodiment, the memory controller 1200, capable of controlling the operation of memory device 1100, may be implemented as a part of the processor 3100 or may be implemented as a chip that is separate from the processor 3100. In addition, the memory controller 1200 may be implemented through an example of the memory controller 1200, shown in FIG. 1, and the memory device 1100 may be implemented through an example of the memory device 1100, shown in FIG. 2.

Figure 9:
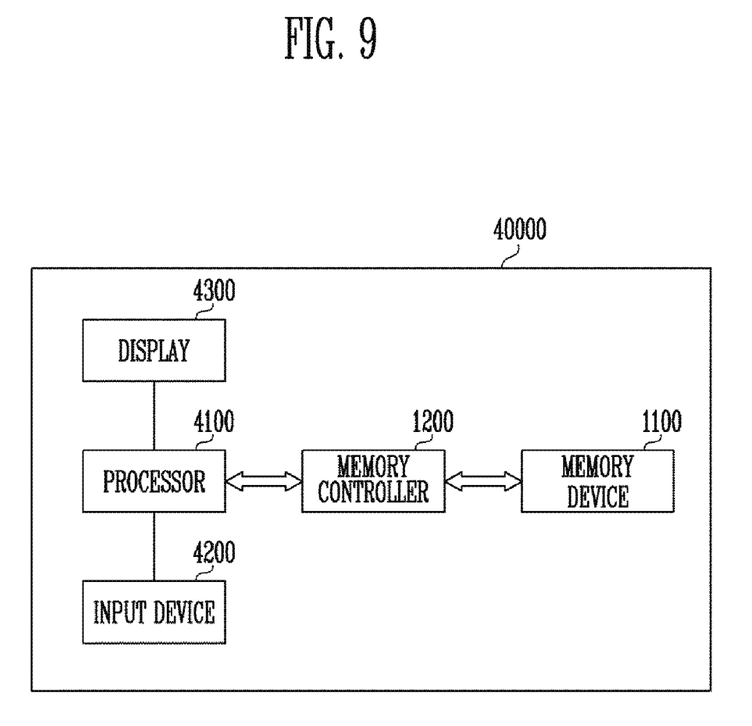
FIG. 9 is a diagram, illustrating another embodiment of the memory system.

FIG. 9 is a diagram, illustrating another embodiment of the memory system.

Referring to FIG. 9, the memory system 40000 may be implemented as a personal computer (PC), a tablet PC, a net-book, an e-reader, a personal digital assistant (PDA), a portable multimedia player (PMP), an MP3 player, or an MP4 player.

The memory system 40000 may include the memory device 1100 and the memory controller 1200 capable of controlling a data process operation of the memory device 1100.

Based on data input through an input device 4200, a processor 4100 may output data that is stored in the memory device 1100 through a display 4300. For example, the input device 4200 may be implemented as a point device, such as a touch pad or a computer mouse, a keypad, or a keyboard.

The processor 4100 may control the operations of the memory system 40000 and control the operation of the memory controller 1200. According to an embodiment, the memory controller 1200, capable of controlling the operation of memory device 1100, may be implemented as a part of the processor 4100 or may be implemented as a chip that is separate from the processor 4100. In addition, the memory controller 1200 may be implemented through an example of the memory controller 1200, shown in FIG. 1, and the memory device 1100 may be implemented through an example of the memory device 1100, shown in FIG. 2.

Figure 10:
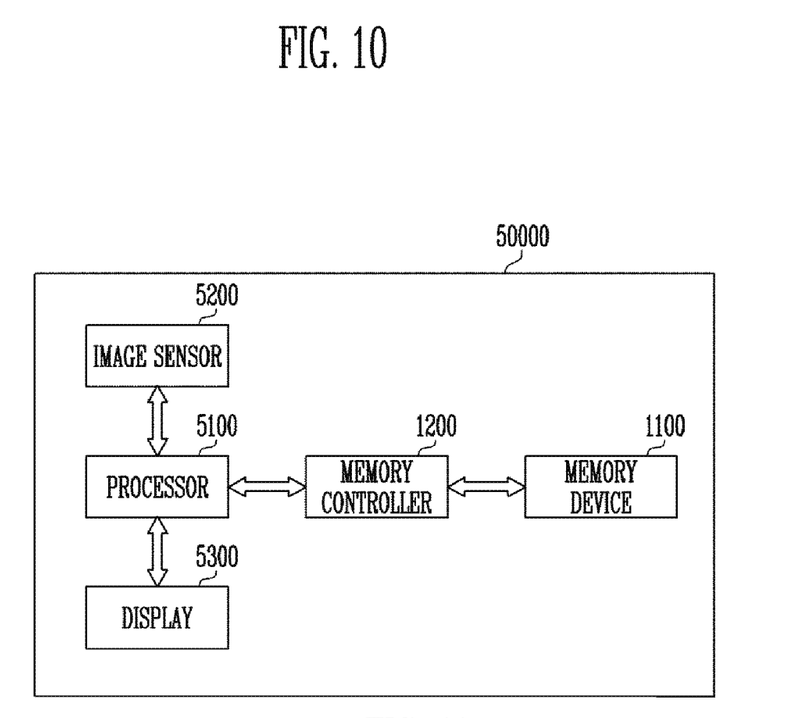
FIG. 10 is a diagram, illustrating another embodiment of the memory system.

FIG. 10 is a diagram, illustrating another embodiment of the memory system.

Referring to FIG. 10, the memory system 50000 may be implemented as an image processing device, for example, a digital camera, a portable phone provided with a digital camera, a smart phone provided with a digital camera, or a tablet PC that is provided with a digital camera.

The memory system 50000 may include the memory device 1100 and the memory controller 1200, the memory controller 1200 being capable of controlling a data process operation, such as a program operation, an erase operation, or a read operation of the memory device 1100.

An image sensor 5200 of the memory system 50000 may convert an optical image into digital signals. The converted digital signals may be transmitted to a processor 5100 or the memory controller 1200. Based on the processor 5100, the converted digital signals may be output through a display 5300 or stored in the memory device 1100 through the memory controller 1200. In addition, data stored in the memory device 1100 may be output through the display 5300 based on the processor 5100 or the memory controller 1200.

According to an embodiment, the memory controller 1200, capable of controlling the operation of memory device 1100, may be implemented as a part of the processor 5100 or may be implemented as a chip that is separate from the processor 5100. In addition, the memory controller 1200 may be implemented through an example of the memory controller 1200, shown in FIG. 1, and the memory device 1100 may be implemented through an example of the memory device 1100, shown in FIG. 2.

Figure 11:
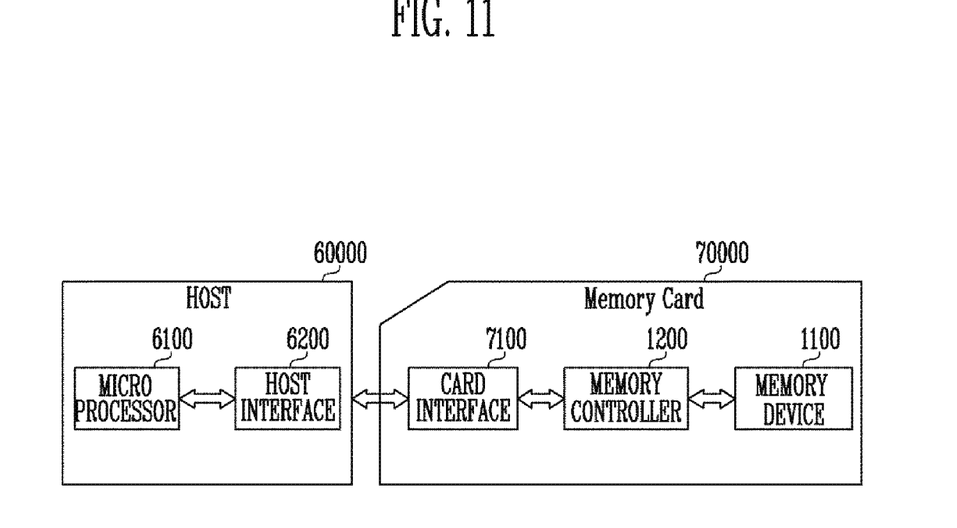
FIG. 11 is a diagram, illustrating another embodiment of the memory system.

FIG. 11 is a diagram, illustrating another embodiment of the memory system.

Referring to FIG. 11, the memory system 70000 may be implemented as a memory card or a smart card. The memory system 70000 may include the memory device 1100, the memory controller 1200, and a card interface 7100.

The memory controller 1200 may control the exchange of data between the memory device 1100 and the card interface 7100. According to an embodiment, the card interface 7100 may be a secure digital (SD) card interface or a multi-media card (MMC) interface, but is not limited thereto. In addition, the memory controller 1200 may be implemented through an example of the memory controller 1200 shown in FIG. 1 and the memory device 1100 may be implemented through an example of the memory device 1100 shown in FIG. 2.

The card interface 7100 may interface data exchange between a host 60000 and the memory controller 1200 based on a protocol of the host 60000. According to an embodiment, the card interface 7100 may support a universal serial bus (USB) protocol and an interchip (IC)-USB protocol. Here, the card interface may refer to hardware that is capable of supporting a protocol that is used by the host 60000, software installed in the hardware, or a signal transmission method.

When the memory system 70000 is connected to a host interface 6200 of the host 60000, such as a PC, a tablet PC, a digital camera, a digital audio player, a mobile phone, a console video game hardware, or a digital set-top box, the interface 6200 may perform data communication with the memory device 1100 through the card interface 7100 and the memory controller 1200 based on a microprocessor 6100.

What is claimed is:

1. A memory device comprising:
a content addressable memory (CAM) block comprising a plurality of pages;
peripheral circuits configured to perform a CAM data read operation to read a CAM data comprising a plurality of check data each indicating whether bad block information is included in a region of the CAM data from a page sequentially selected among the plurality of pages; and
a CAM data read controller configured to perform a CAM data load operation to receive the CAM data from the peripheral circuits, and to output the CAM data to an external memory controller,
wherein the CAM data read controller is configured to stop the CAM data load operation based on at least one check data among the plurality of check data included in the CAM data.

2. The memory device of claim 1, wherein the CAM data further includes a plurality of data segments and CRC code data, and each of the plurality of data segments includes a check data among the plurality of check data.

3. The memory device of claim 2, wherein first data segments, corresponding to a bad block among the plurality of data segments, include an address data of the bad block and the check data, and
wherein the check data is disposed at a specific position in each of the plurality of data segments.

4. The memory device of claim 2, further comprising:
a control logic configured to control whether to perform the CAM data read operation by the peripheral circuits,
wherein the CAM data read controller is configured to, if a first CAM data which is read from a first page selected among the plurality of pages includes at least one check data having a first value indicating that the bad block information is not included, control the peripheral circuits to stop reading a second CAM data from a second page to be selected next to the first page among the plurality of pages, and output a stop signal to the control logic, and
wherein, in response to the stop signal, the control logic is configured to control the peripheral circuits to stop reading the second CAM data from the second page.

5. The memory device of claim 4, wherein the CAM data read controller is configured to:

if the first CAM data includes a first check data having the first value and a second check data having a second value indicating that the bad block information is included, mask a first data segment comprising the first check data among the plurality of data segments and control the peripheral circuits to stop reading the second CAM data from the second page, and
output a second data segment comprising the second check data among the plurality of data segments and the CRC code data.

6. The memory device of claim 4, wherein the CAM data read controller comprises:
a CAM data register configured to temporarily store the first CAM data, and output a plurality of check data included in a plurality of data segments of the first CAM data;
a data checker configured to, if the plurality of check data output from the CAM data register comprise the at least one check data having the first value, output a detection signal; and
a read control signal generator configured to output the stop signal in response to the detection signal output from the data checker.

7. The memory device of claim 6, wherein the CAM data register is configured to:
mask at least one data segment corresponding to the at least one check data among the plurality of data segments of the first CAM data, in response to the detection signal, and
output a remaining data segment excluding the at least one data segment among the plurality of data segments of the first CAM data and the CRC code data.

8. A memory system comprising:
a memory device including a content addressable memory (CAM) block comprising a plurality of pages, the memory device configured to perform a CAM data read operation to read a CAM data comprising a plurality of check data each indicating whether bad block information is included in a region of the CAM data from a page sequentially selected among the plurality of pages, and perform a CAM data load operation to output the CAM data to the memory controller; and
a memory controller configured to receive the CAM data from the memory device, and update bad block information based on the CAM data,
wherein the memory device is configured to stop the CAM data load operation based on at least one check data among the plurality of check data included in the CAM data.

9. The memory system of claim 8, wherein the memory device comprises:
a plurality of memory blocks;
peripheral circuits configured to perform the CAM data read operation;
a CAM data read controller configured to receive the CAM data from the peripheral circuits, and perform the CAM data load operation; and
a control logic configured to control whether to perform the CAM data read operation by the peripheral circuits,
wherein the CAM data read controller is configured to stop the CAM data load operation based on the at least one check data included in the CAM data.

10. The memory system of claim 9, wherein the CAM data includes a plurality of data segments and CRC code data, and each of the plurality of data segments includes a check data among the plurality of check data.

11. The memory system of claim 10, wherein
the check data is disposed at a specific position in each of the plurality of data segments.

12. The memory system of claim 10, wherein the CAM data read controller is configured to, if a first CAM data which is read from a first page selected among the plurality of pages includes at least one check data having a first value indicating that the bad block information is not included, control the peripheral circuits to stop reading a second CAM data from a second page to be selected next to the first page among the plurality of pages, and output a stop signal to the control logic, and
wherein, in response to the stop signal, the control logic is configured to control the peripheral circuits to stop reading the second CAM data from the second page.

13. The memory system of claim 12, wherein the CAM data read controller is configured to:
if the first CAM data includes a first check data having the first value and a second check data having a second value indicating that the bad block information is included, mask a first data segment comprising the first check data among the plurality of data segments and control the peripheral circuits to stop reading the second CAM data from the second page, and
output a second data segment comprising the second check data among the plurality of data segments and the CRC code data.

14. The memory system of claim 12, wherein the CAM data read controller comprises:
a CAM data register configured to temporarily store the first CAM data, and output a plurality of check data included in a plurality of data segments of the first CAM data;
a data checker configured to, if the plurality of check data output from the CAM data register comprise the at least one check data having the first value, output a detection signal; and
a read control signal generator configured to output the stop signal in response to the detection signal output from the data checker.

15. The memory system of claim 14, wherein the CAM data register is configured to:
mask at least one data segment corresponding to the at least one check data among the plurality of data segments of the first CAM data, in response to the detection signal, and
output a remaining data segment excluding the at least one data segment among the plurality of data segments of the first CAM data and the CRC code data.

16. The memory system of claim 10, wherein the memory controller is configured to:
decode the CAM data using the CRC code data included in the CAM data, and
update the bad block information based on the decoded CAM data.

17. A method of operating a memory system comprising a memory device including a CAM (content addressable memory) block, the method comprising:
reading a CAM data comprising a plurality of check data each indicating whether bad block information is included in a region of the CAM data, from a page sequentially selected among a plurality of pages included in the CAM block, during a CAM data read operation; and
outputting the CAM data to a memory controller, during a CAM data load operation; and
stopping the CAM data load operation based on at least one check data included in the CAM data.

18. The method of claim 17, wherein the stopping the CAM data load operation comprises:
if the CAM data includes a first check data indicating that the bad block information is not included and a second check data indicating that the bad block information is included, masking a first data segment comprising the first check data among a plurality of data segments included in the CAM data; and
outputting a second data segment comprising the second check data among the plurality of data segments and CRC code data, included in the CAM data.

* * * * *